United States Patent [19]

Malm et al.

[11] Patent Number: 5,673,201

[45] Date of Patent: Sep. 30, 1997

[54] SUB-PROBLEM EXTRACTION METHOD FOR WIRING LOCALIZED CONGESTION AREAS IN VLSI WIRING DESIGN

[75] Inventors: Richard LaVerne Malm; Charles L. Meiley, both of San Jose, Calif.

[73] Assignee: International Business Machines Corporation, Armonk, N.Y.

[21] Appl. No.: 621,258

[22] Filed: Mar. 21, 1996

Related U.S. Application Data

[63] Continuation of Ser. No. 953,611, Sep. 29, 1992, abandoned.

[51] Int. Cl.$^6$ .................................................. G06F 17/50
[52] U.S. Cl. ........................ 364/491; 364/489; 364/490
[58] Field of Search .................................. 364/489, 490, 364/491, 488, 550, 551.01; 395/500, 779, 133, 523

[56] References Cited

U.S. PATENT DOCUMENTS

| | | | |
|---|---|---|---|
| 4,484,292 | 11/1984 | Hong et al. | 364/491 |
| 4,571,451 | 2/1986 | Linsker et al. | 174/68.5 |
| 4,593,363 | 6/1986 | Burstein et al. | 364/491 |
| 4,607,339 | 8/1986 | Davis | 364/491 |
| 4,613,941 | 9/1986 | Smith et al. | 364/490 |
| 4,686,629 | 8/1987 | Noto et al. | 364/491 |
| 4,823,276 | 4/1989 | Hiwatashi | 364/491 |
| 4,835,705 | 5/1989 | Fujino et al. | 364/491 |
| 4,839,821 | 6/1989 | Murakata | 364/491 |
| 4,858,143 | 8/1989 | Fournier | 364/491 |
| 4,890,238 | 12/1989 | Klein et al. | 364/491 |
| 4,908,772 | 3/1990 | Chi | 364/489 |
| 4,918,614 | 4/1990 | Modarres et al. | 364/490 |
| 5,014,265 | 5/1991 | Hahne et al. | 370/60 |
| 5,038,294 | 8/1991 | Arakawa et al. | 364/491 |
| 5,202,840 | 4/1993 | Wong | 364/490 |
| 5,208,764 | 5/1993 | Rusu et al. | 364/488 |
| 5,225,991 | 7/1993 | Dougherty | 364/491 |
| 5,249,134 | 9/1993 | Oka | 364/491 |
| 5,311,443 | 5/1994 | Crain et al. | 364/491 |
| 5,355,322 | 10/1994 | Yamashita et al. | 364/490 |
| 5,359,537 | 10/1994 | Saucier et al. | 364/489 |
| 5,471,398 | 11/1995 | Stephens | 364/490 |

FOREIGN PATENT DOCUMENTS

| | | | |
|---|---|---|---|
| 0312680 | 3/1988 | European Pat. Off. | A21C 11/10 |
| 0430571 | 11/1990 | European Pat. Off. | H04L 12/56 |

OTHER PUBLICATIONS

R.L. Rivest, "The 'PI' (Placement and Interconnect) System", Proceedings of the 19th IEEE Design Automation Conference (1982), pp. 475–481.

Fiduccia and Mattheyses, "A Linear–Time Heuristic for Improving Network Partitions", IEEE, Apr. 22, 1982.

Kirkpatrick et al., "Optimization by Simulated Annealing," Science, 13 May 1983, pp. 671–680.

Ralph Linsker, "An Iterative Improvement Penalty–Junction–Driven Wire Routing System," IBM J. Res Develop, vol. 28, No. 5, Sep. 1984, pp. 613–624.

*Primary Examiner*—Kevin J. Teska
*Assistant Examiner*—Thai Phan
*Attorney, Agent, or Firm*—Baker, Maxham, Jester & Meador

[57] ABSTRACT

A computer-implementable method for wiring congested areas in a VLSI design detects overflows indicating an area of congestion in the VLSI design and defines a bounding area around the area of congestion. Attachment points are created at locations where wires cross the bounding area and the entire bounding area, with the attachment points, is extracted from the VLSI design as a sub-design. Initial wire weights are assigned to wiring parameters associated with the sub-design. Thereafter, an iterative process is commenced to derive a wiring solution for the sub-design. In a first step of the iterative process, an attempt is made to wire the sub-design with the assigned wire weights. In subsequent steps, at least one wire weight is changed and a new attempt is made to wire the sub-design using the new wire weight values. The process continues in this manner until a wiring attempt completes successfully. The wired solution for the sub-design is then placed back into the VLSI design.

21 Claims, 6 Drawing Sheets

SUB-PROBLEM EXTRACTION METHOD FOR WIRING LOCALIZED CONGESTION AREAS IN VLSI WIRING DESIGN

This application is a continuation of application Ser. No. 07/953,611, filed Sep. 29, 1992, now abandoned.

BACKGROUND OF THE INVENTION

The present invention relates generally to computerized methods for wiring VLSI designs, and more particularly to methods for wiring localized congestion areas following a failed VLSI global wiring attempt.

Wiring or "routing" is concerned with finding paths between points in a circuit which may represent the terminals of processing elements arranged at selected locations on a circuit substrate. For wiring complex circuits such as VLSI designs, automated wiring programs are used due to the tremendous complexity involved. Such designs include many thousands of signal paths arranged on multiple layers, with vias being provided between layers. FIG. 1 graphically illustrates a very simple wiring problem which is to be solved. Here a grid system is shown where at most one signal wire can be placed at each grid point. The grid is scaled so that the center to center distances for the wires meets the constraints imposed by technology ground rules. In FIG. 2, the layout is redrawn to indicate grid points which contain wires, referred to as blockages, by cross-hatched grid points. Assuming it is desired to find a path from A to B, it can be seen that this problem corresponds to that of finding a path through a maze. Conventional routing procedures attempt to find a minimal cost path in the maze between two points, if such a path exists. Cost can be quite general, and can depend on such factors as length, density, number of jogs and other parameters.

In some cases, determination of the minimum path length may be of paramount concern. In FIG. 2, starting with grid point A, cumulative cost values are assigned to successive unblocked grid points. This process terminates when grid point B is reached and the lowest cumulative cost value at that grid point is indentified. To find a path, grid points are retraced from B to A, as shown in FIG. 3. In other cases, the shortest path length is not always the optimum path between points in a circuit. Other design parameters, such as preferred wiring directions, the number of vias and other factors may influence determination of the optimum path. By strategically assigning cost or weight values corresponding to these design parameters, preferred direction routes can be quickly obtained. Such costs can include:

1. The cost of using an individual grid point. This cost could be a function of density.

2. The cost of moving one grid point in a preferred direction on a layer.

3. The cost of moving one grid point in a nonpreferred direction on a layer.

4. The cost of a via, i.e., of going from one layer to another.

In FIG. 4, a grid point a and three of its neighbors b, c, and d are shown. Assume the individual grid point costs $CI_b$, $CI_c$ and $CI_d$ for grid points b, c and d are 3, 2 and 1, respectively. Assume further that the cost of moving one grid point in the preferred direction on layer 1 $CP_1=1$, the cost of moving one grid point in the nonpreferred direction on layer 1 $CN_1=5$, and the cost of a via $C_v=12$. The cumulative costs $CC_b$, $CC_c$ and $CC_d$ for grid points b, c and d are computed below, where the cumulative cost $CC_a$ at grid point a is 20:

$$CC_b = CC_a + CP_1 + CI_b = 20+1+3 = 24$$

$$CC_c = CC_a + CN_1 + CI_c = 20+5+2 = 27$$

$$CC_d = CC_a + CV + CI_d = 20+12+1 = 33$$

From grid point a, moving to grid point b results in the least cost of any direction. Using automated procedures, multiple wiring directions based on least cost analysis can be tested until a final path of least cost is determined. Such procedures, however, rapidly increase in complexity as a function of the number of grid points between the points to be joined. Indeed, existing programs for wiring complex VLSI designs may require days of CPU time to run.

Given the processing demands inherent in global wiring efforts, it is desirable to limit the number of wiring attempts involving large circuit segments. Often, however, localized design changes are required as a result of repositioning circuit components. It would be advantageous to provide a method for effecting such design changes without rewiring the entire design. It is also often the case that a global wiring program fails to complete successfully as a result of localized wiring failures or "overflows". A overflow condition exists when a wiring assignment violates one or more design rules. When overflows result, conventional wiring programs typically resort to multi-pass rip out and rewire attempts to reduce overflow count in the congested areas. These rewire attempts are usually based on the original wiring attack plan or wire weighting scheme which does not change across the design. If all the wires cannot be automatically routed they must be "embedded" manually. Due to a lack of local optimization, this process can result in wires that exceed maximum acceptable length and may provide poor design operation (i.e., slow performance). Moreover, manual wiring is performed by a human operator who usually sits at a display terminal that graphically illustrates the congestion area. The embedding process is painstakingly slow and error prone. Wiring solutions that appear correct on the display screen may actually violate one or more design ground rules, thus requiring rip out.

SUMMARY OF THE INVENTION

The present invention is directed to a computer implementable method for wiring congested areas in a VLSI design following a failed global wiring attempt. Additionally, the method can be used to rewire areas of localized design modification. In accordance with a preferred embodiment, overflows indicating an area of congestion in the VLSI design are detected and a bounding area is defined around the area of congestion. An "overflow" occurs when two points in a circuit cannot be wired because of blockages caused by circuit components or other wires. Attachment points are created at locations where wires cross the bounding area and the entire bounding area, with the attachment points, is extracted from the VLSI design as a sub-design. Initial wire weights are assigned to wiring parameters associated with the sub-design. Each wiring parameter corresponds to a direction that a wire can take and each weight represents a cost associated with taking that direction. Typical direction parameters include north-south, east-west, up-down (vias between layers), positive-negative diagonal and jogs. Thereafter, an iterative process is commenced to derive a wiring solution for the sub-design. In a first step of the iterative process, an attempt is made to "establish" or "map" wire paths through the sub-design using the assigned wire weights. In subsequent steps, selected wire weights are changed over a range of values above and below the starting value. Successive attempts are made to wire the sub-design using the new wire weight values. The process continues in this manner until a wiring attempt completes successfully, that is, until zero overflows remain. The wired solution for the sub-design is then placed back into the VLSI design.

DETAILED DESCRIPTION OF THE PREFERRED EMBODIMENTS

The sub-problem extraction method of the present invention is intended to operate externally of, and provide input data sets to, a conventional global wiring tool for wiring VLSI designs. Virtually any global wiring tool that operates by assigning wire weights corresponding to selected wiring parameters can be used. However, some of the parameters used by the sub-problem extraction method described herein may have to be modified to correspond to those used by the global wiring program. In practice, the sub-problem extraction method is implemented as a computer software program which could be written in any number of conventional programming languages including the Pascal language. It will be appreciated that a program written in accordance with the invention could be advantageously run on a variety of computer hardware platforms including the IBM line of 370 mainframe systems running under the MVS or VM operating systems, or a work station running under the UNIX or AIX operating systems. In this environment, the sub-problem extraction method generates successive data sets and iteratively calls the global wiring program to attempt a wiring solution using input wire weights, until a zero overflow solution is achieved.

Figure 1:
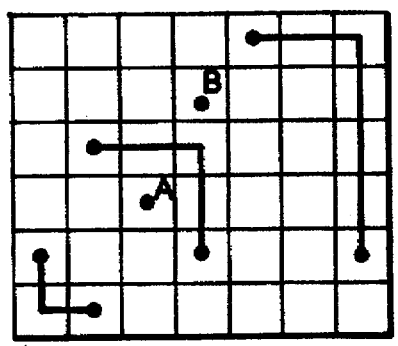
FIGS. 1–4 illustrate a simple wiring problem to be solved by assigning cost values to different wiring directions in accordance with conventional wire routing methodologies.
Figure 2:
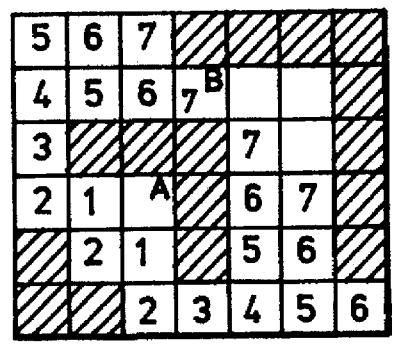
Figure 3:
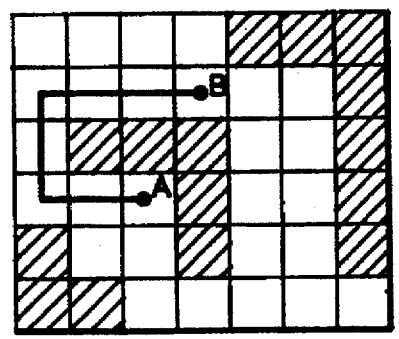
Figure 4:
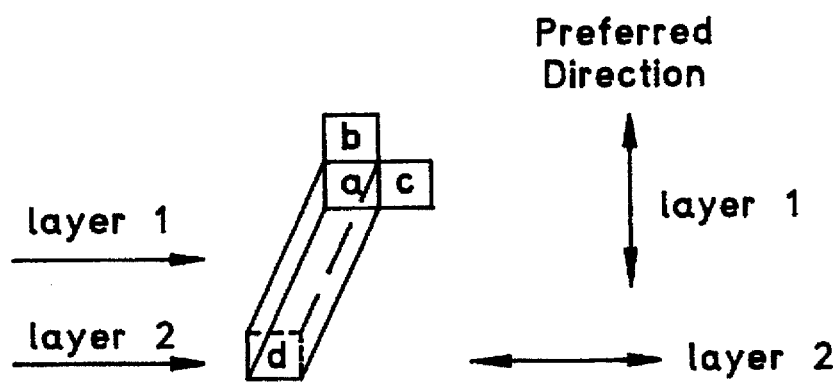
Figure 5:
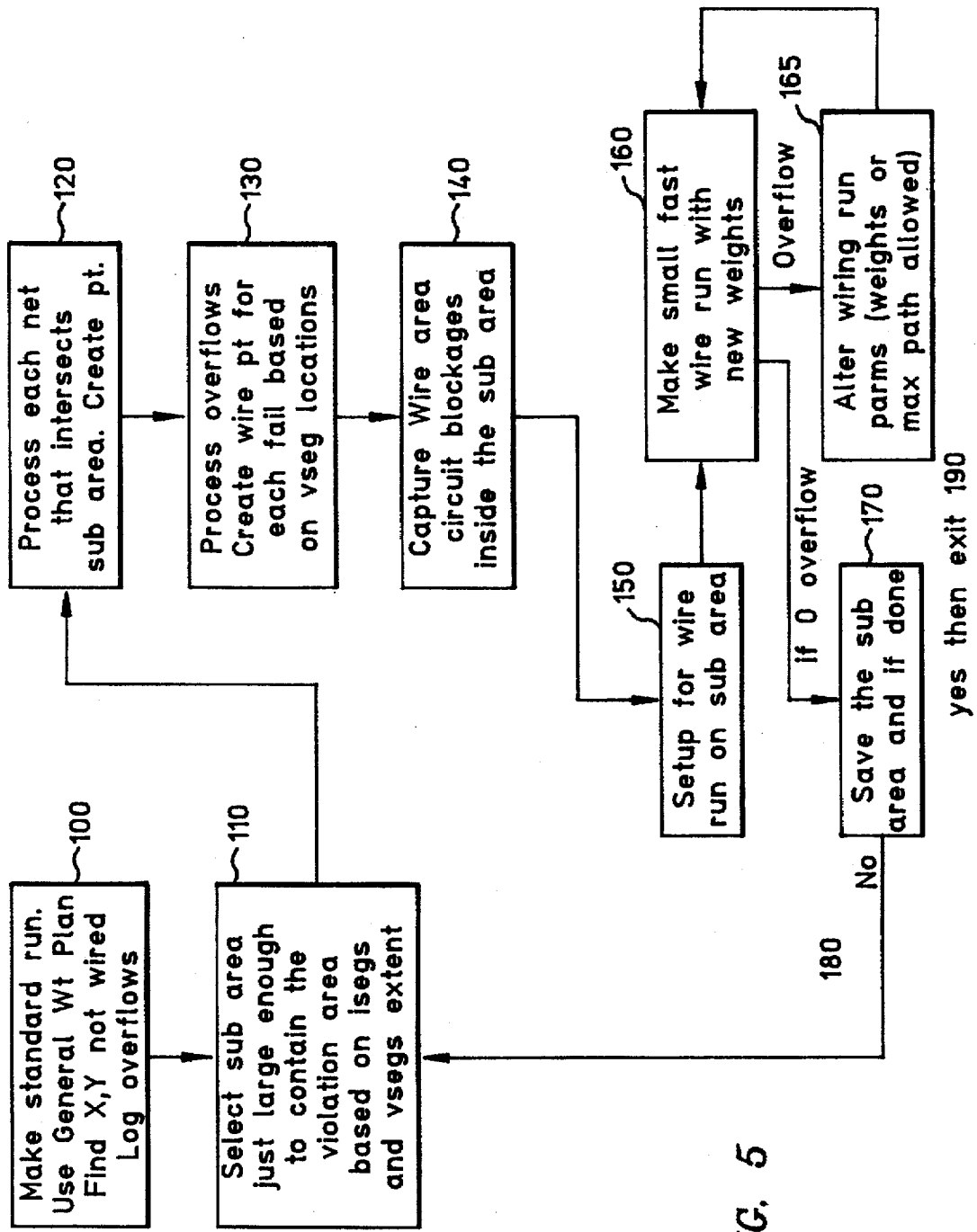
FIG. 5 is a flow diagram illustrating a sub-problem extraction method in accordance with the present invention.

Referring now to FIG. 5, components of a preferred sub-problem extraction method are illustrated diagramatically. As will be appreciated from the disclosure hereinafter set forth, the method adopts a divide and conquer approach to solving wiring congestion errors by identifying local problem areas and then modifying wire weight parameters until a unique solution is found for that sub-area. These weights are advantageously adjusted depending on specific local attributes such as physical layout of the high density areas. In a first step of the process a global wiring program is activated and one or more wiring attempts are made across the entire VLSI design using a set of general wire weights to complete as much of the wiring as possible, as shown in process step 100 of the flow diagram of FIG. 1. In the design of a VLSI chip, the global wiring program may require 10 to 20 CPU hours run time. Local areas of failure are usually not known to exist until several long wire runs have been completed. These local areas may remain non-wirable even after initial attempts are made to change the placement of wired items on the chip.

Following the one or more global wiring attempts, areas of congestion can be identified from the output of the global wiring program which conventionally includes row and column information (x and y coordinates) corresponding to areas of local congestion, a list of completed nets, a list of circuit node pairs to be wired and blockage data showing the placement of circuit components. An example of a congestion area is illustrated graphically in FIG. 6.

The selection of a sub-problem extration area occurs in process step 110. This step can be advantageously implemented as a computer software routine that extracts relevant information from the output of the global wiring program for the determination of a usable sub-area containing one or more overflow nets (a net is a wiring connection between two points or nodes in a circuit).

Each overflow net can be thought of as including two portions or segments, ISEGs (invalid net segments) and VSEGs (valid net segments). The VSEGs are valid wire sub-sections of the overflow net. The ISEGs are invalid wire sub-sections of the overflow net since they have ground rule violations. They indicate the path that the net would like to take and which is taken during the global wiring attempt in order to wire the overflow net. Ground rule violations occur when the net intersects another net on the same plane or when some other design parameters (e.g. minimum net spacing) are violated.

Figure 6:
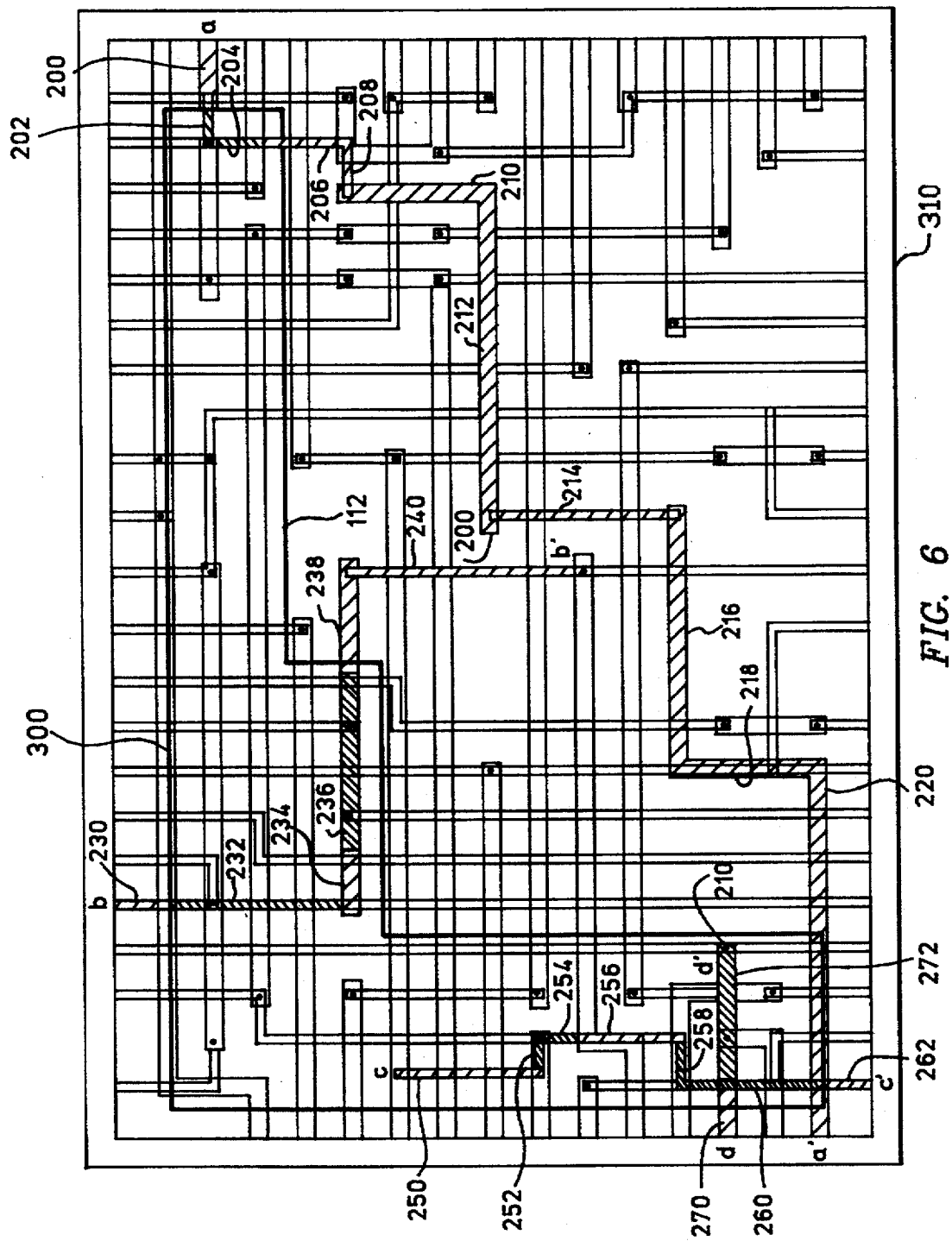
FIG. 6 is a diagrammatic view of a circuit board showing an area containing congestion overflows.

FIG. 6 illustrates a congestion area having two wiring layers. Wires in the first layer are shown as being (relatively) wide and wires in the second layer are shown as being (relatively) thin. There are four overflow nets shown in FIG. 6. A first overflow net extends between points a and a', a second overflow net extends between points b and b', and a third overflow net extends between points c and c', and a fourth overflow net extends between points d and d'.

The overflow net wired between points a and a' includes a series of valid and invalid segments. A first segment 200 is valid. The net becomes invalid at segment 202 because it must use a layer change to the second layer which is already being used. Segment 204, like 202, is also invalid because it overlies another wire that was previously positioned in the second layer. Segments 206, 208, 210, 212, 214, 216, 218 and 220 are all valid and contain no ground rule violations.

The overflow net between points b and b' also includes a series of valid and invalid segments. A first segment 230 is valid. A second segment 232 is invalid because it overlies a previously placed net in the second layer. The segment 234 is valid. The next segment 236, however, is invalid because it overlies a previously placed net in the first layer. Remaining segments 238 and 240 are both valid.

In the third net between points c and c' are additional valid and invalid segments. The segment 250 is valid. The succeeding two segments 252 and 254 are invalid. The subsequent segment 256 is valid. Segments 258 and 260 are both invalid while the final segment 262 is valid. In the fourth net between points d and d' the initial segment 270 is valid while the final segment 272 is invalid.

The coordinate size of the local or bounding area to be extracted can be specified based on the expected run time of the sub-area, which is preferably less than one second. In FIG. 6, a VLSI congestion area containing a minimum sub-area 300 could be based on extension and expansion of the ISEGS to the edge of the Figure. A slightly larger rectangular area 310 containing all of the VSEG net segments allows more possible net paths yet keeps the problem size small enough to create a complete solution. This allows conventional wiring techniques such as simulated evolution, simulated annealing or semi-exhaustive iteration to be applied to solve each of the sub-areas.

Following the determination of a suitable sub-area in process step 110, process steps 120 and 130 are performed to fix wire locations on the sub-area perimeter and to generate a net list of ordered node pairs requiring connection within the sub-area. In process step 120, the wire locations for the non-failed nets are fixed on the bounding box for the area using the coordinate positions that the net wires cross the box as determined from the output of the global wire run. Preferably, the box will be large enough to allow all nets that pass into or out of the box to be allocated to a location on the perimeter. In process step 130, the overflow nets are allocated to the edge of the identified sub-area box using the coordinate positions of the VSEG portions of the overflow nets as determined from the output of the global wiring run. In process step 140, blockage data including the coordinate location and size of circuit components are captured inside the sub-area.

Once the sub-area net wire points and blockage data are identified, iterative techniques are used to solve each sub-problem. In process step 150, the sub-area problem as defined by the local net list and blockage data are input to the global wiring program. In process step 160 of the flow diagram, a first pass of a global wiring program is made using initialized values for wire weights corresponding to wire direction, wire jogs, level changes, maximum wire length, via count, via direction, net list order or other parameters as desired. These initial values are provided as input by the user and are empirically determined based on design constraints set by the user. For example, it may be a design goal to minimize overall wire length. The initial wire weight values are selected to best achieve that goal. Other design optimization goals could result in the selection of different initial wire weight values. For example, the net list may be arranged in a preferred initial order of decreasing or increasing length. Following the selection of these initial input values, and upon determining that a zero overflow solution was not produced, the wire weights are adjusted in process step 165 and the global wiring program is again executed. This iterative process proceeds one or more times as necessary in process steps 160 and 165 until a zero overflow solution is produced.

In the preferred methodology, the strategy for responding to an overflow solution is to first swap each pair of nets with the same length and rewire the sub-area until all pairs of each length have been tested. This net list adjustment can be rapidly performed using a software routine that swaps the successive net list pairs and iteratively invokes the global wiring program to operate on the new input values. The swapping of net list pairs may produce a zero overflow case. If not, then iteration on the other wire weights, which may include a maximum total weight value, is performed until a zero overflow solution is found. By starting with a "best guess" at the wire weights and slowly increasing the maximum allowable wire weighted distance (global weight value) before rip out and rewire, a solution may be rapidly produced. If not, the wire weights are successively adjusted over a range of values above and below the starting wire weight values. Once zero overflows are found, the result is captured as a solution subset. The captured result is provided in process step 170 as a sub-cell of the design and "interconnected" to the initial incomplete wire image by incorporating the solution subset in the global design. If additional congestion areas exist, the process returns via path 180 to step 110. Once all areas have been completed, and the final design is completely wired with no overflows, the sub-problem extraction process is terminated in step 190.

Figure 7A:
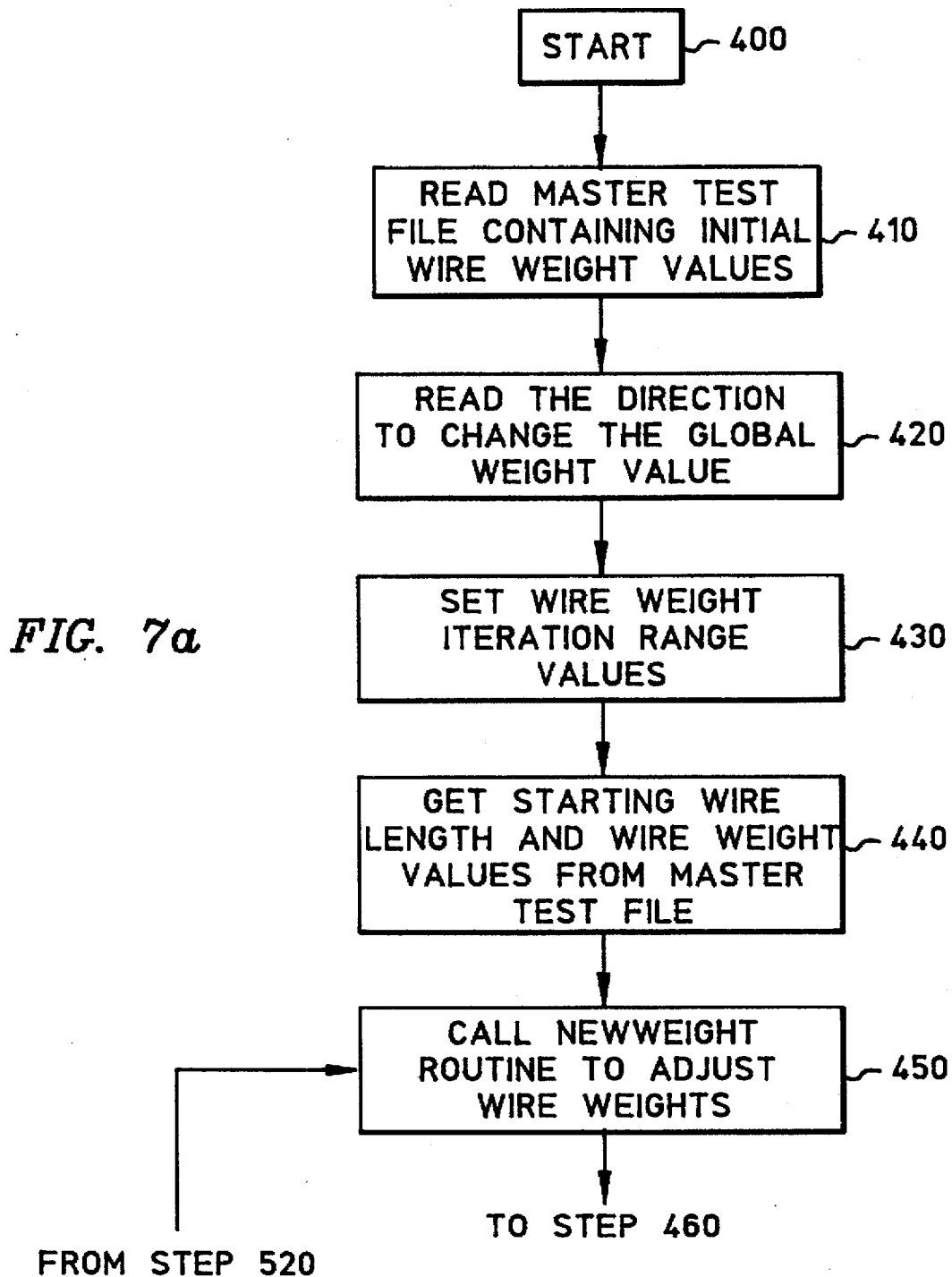
FIGS. 7A and 7B represent a flow diagram illustrating a method for changing wire weights in accordance with the present invention.
Figure 7B:
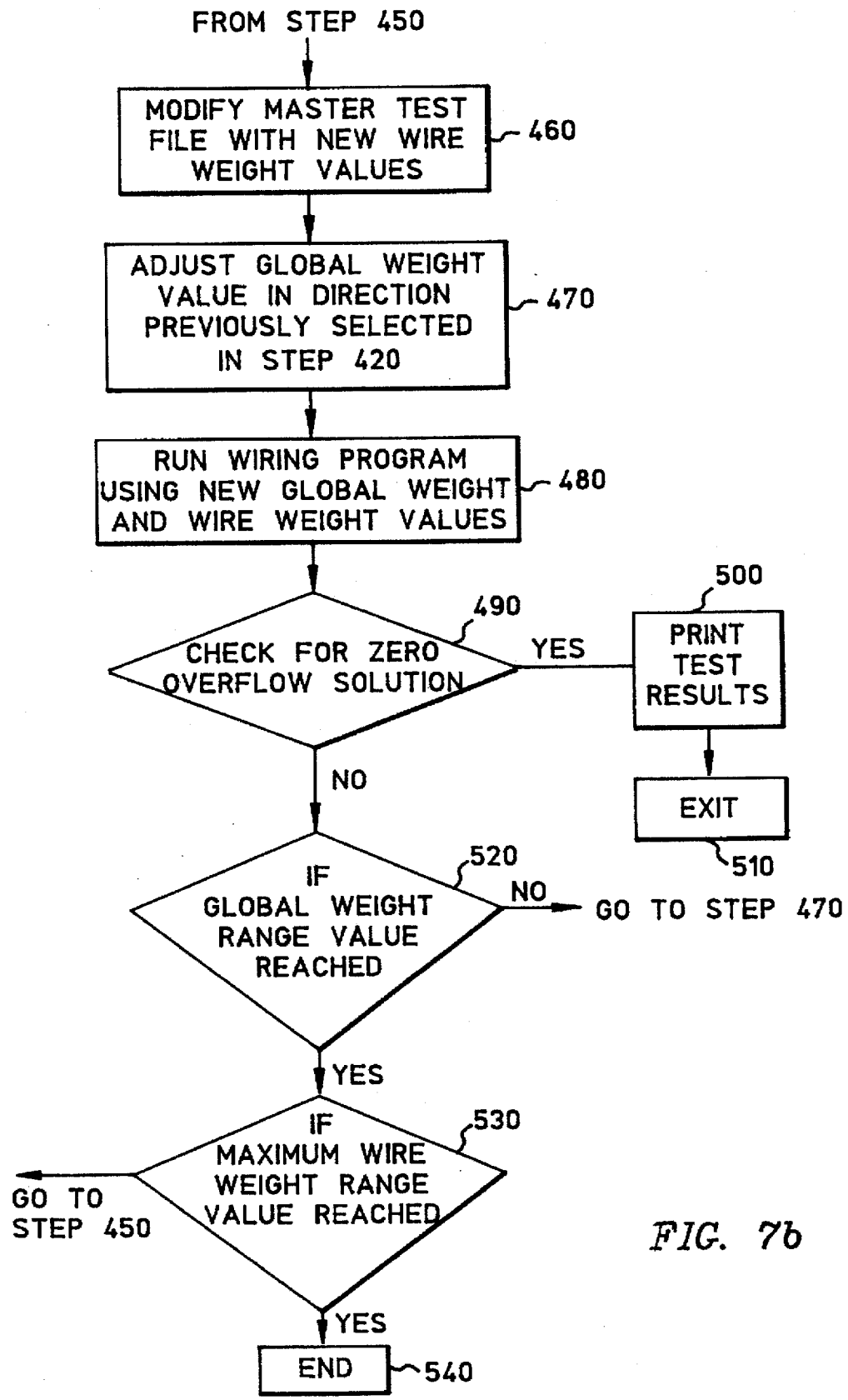
Figure 8:
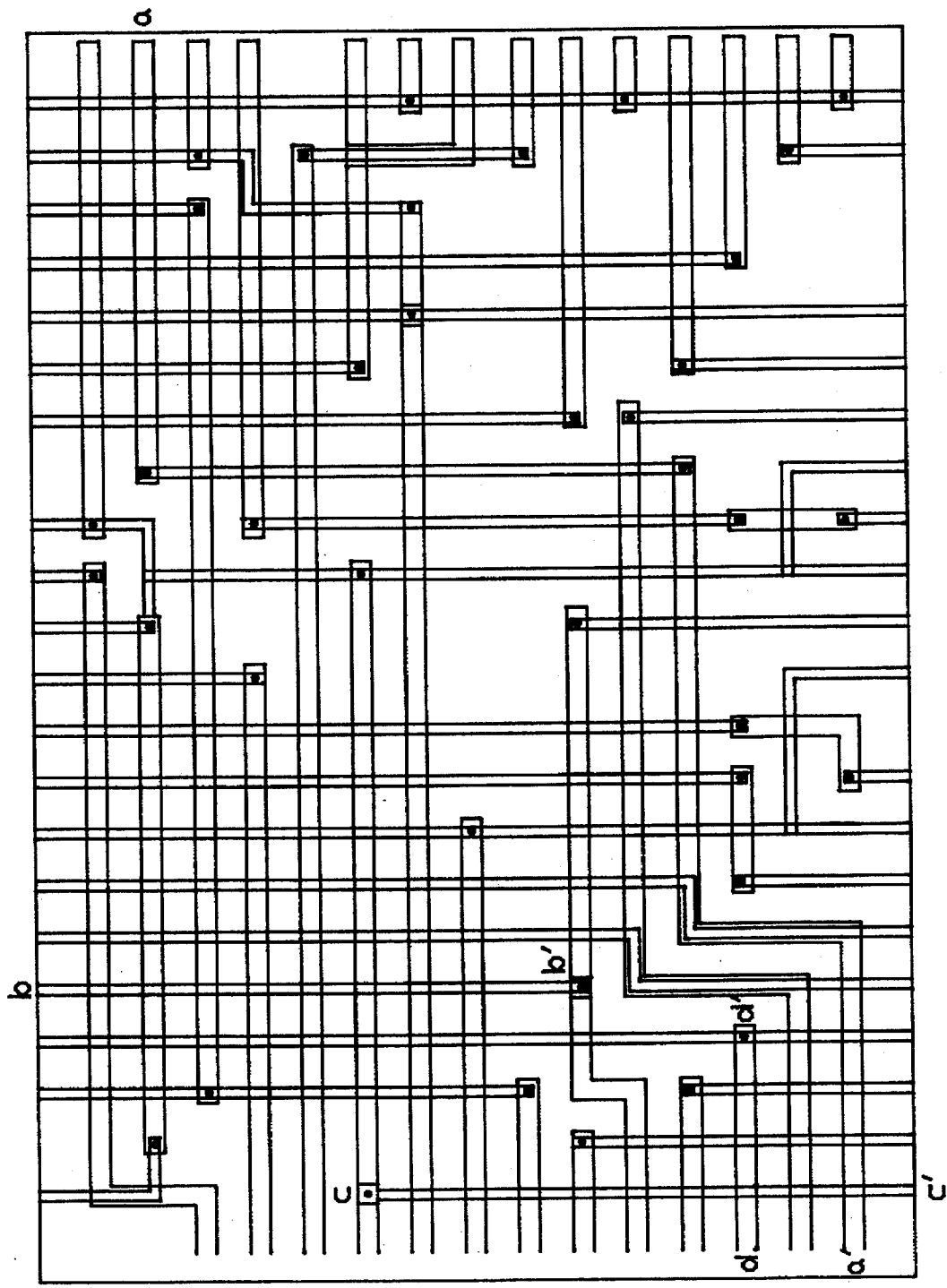
FIG. 8 is a diagrammatic illustration of the circuit board of FIG. 6 showing correction of the wiring overflow congestion area.

Referring now to FIGS. 7A and 7B, a procedure for altering wire weight values as performed in process step 165 is illustrated in more detail. This procedure is also shown in pseudocode form in Appendix A hereto. It is intended for operation with any conventional global wiring program which utilizes wire weight values including weight values indicating wire direction, jogs, level changes and wire length. The wire weighting procedure starts in process step 400 and proceeds to initialization step 410. In step 410, the program reads a previously generated master test file TEST containing initial wire weight values. A sample TEST file is illustrated below. It is generated using empirically determined wire weight values provided by a user, and contains wire weight information for a VLSI design consisting of two levels identified as "plane 1" and "plane 2". The wiring parameters of interest in this example are NS=north-south, EW=east-west, UP=up, DN=down, PD=positive diagonal, ND=negative diagonal, and J=jog. There is also a maximum total weight value (shown in line four of the TEST file). The TEST file is arranged in the following format:

| (1) Y 100 100 Y | * Iterate (Y/N) IMAX DMAX |
|---|---|
| (2) I | * via-via adjacency for vias between wiring planes 1 and 2 |
| (3) F | * Length(L) or Factor(F) for maximum wire length |
| (4) 3.5000 | * Maximum length or factor |
| (5) *NS EW UP DN PD ND J | |
| (6) 02 04 04 00 00 00 2 | * Weight values for wiring plane 1 |
| (7) * | |
| (8) 02 01 00 02 00 00 2 | * Weight values for wiring plane 2 |

In line (3) of the TEST file, an "L" character indicates that the numerical value in line (4) represents a maximum length of a wire. If line (3) contains an "F" character, the value in line (4) is the factor by which the "manahattan" (minimum) distance between the nodes is multiplied, to obtain the maximum length. The "L" character sets a maximum length for all nets. The "F" character allows a maximum length to be set for each net.

The initialization step 410 is illustrated in lines 4–15 of the pseudocode in Appendix A. In process step 420, a direction value "u" is read to indicate the direction to change the global weight value during the wiring iteration process. This process step spans lines 16–25 of the pseudocode in Appendix A. Lines 26–38 of the pseudocode represent process step 430 wherein the wire weight iteration range values are set. These range values represent the amounts the wire weights will be incremented and decremented during the process. As indicated in the pseudocode, the two 45 degree wire weights PD and ND are not utilized in the example shown but could be added if desired. In process step 440, represented by lines 39–54 of the pseudocode of Appendix A, the starting maximum wire length and wire weight values are obtained from the TEST file. In line 41 of the pseudocode, the sixth line of the TEST file, representing the wire weights for wiring plane 1, are assigned to the variables sr1 sr2 sr3 sr4 sr5 sr6 and sr7. Similarly, in line 42 of the pseudocode, the wire weights shown on the eleventh line of the TEST file are assigned to the variables sg1 sg2 sg3 sg4 sg5 sg6 and sg7. Headings for the various weight values are printed out in line 45 of the pseudocode.

In process step 450, represented by lines 55–70 of the pseudocode in Appendix A, the NewWeight routine is called to adjust the wire weights. The NewWeight routine is set forth in pseudocode form in Appendix B hereto. As shown in the pseudocode of Appendix A, the NewWeight routine is called in a series of nested wire weight adjustment loops each corresponding to one of the wire weight values to be adjusted. For each of the wire weight parameters, NewWeight is called a number of times that equals the range value established in step 430. Each time NewWeight is called, a previous value for the wire weight of interest is passed to the NewWeight routine along with an index value. Depending on the index value, the wire weight is incremented and decremented by successively greater amounts over a range of values above and below the initial wire weight value until the associated wire weight range value is reached. The adjusted wire weight value is passed back to the pseudocode routine of Appendix A as a variable "π__".

Once the NewWeight routine is initially called for each of the wire weight values, the returned wire weight values (which are unchanged from the initial TEST values the first time NewWeight is called) are placed back in the TEST file in process step 460, as illustrated in lines 71–73 of the pseudocode in Appendix A (subsequent calls to NewWeight will change the wire weight values). In process step 470, commencing at line 81 of the pseudocode of Appendix A, the allowable maximum total weight value associated with the sub-area is incremented (or decremented) by an index value as determined in process step 420. The iterative adjustment of the maximum total weight value represents an innermost loop of the wire weighting procedure. Each time the maximum total weight value is adjusted, the global wiring program is called in process step 480, represented by lines 95–104 of the pseudocode of Appendix A. In process step 490, the results of the wiring program are tested to determine whether a zero overflow solution has been found, as shown in lines 105–111 of the pseudocode of Appendix A. If a solution is found, the results are printed in process step 500 and the program terminates in process step 510, as illustrated in lines 107–110 of the pseudocode of Appendix A.

If no zero overflow condition is found, the procedure returns to process step 470 (line 81 of the pseudocode of Appendix A) where the maximum total weight value is again incremented (or decremented). The incrementation of the maximum total weight value proceeds for a specified number of iterations in process step 520 which are shown by way of example as equalling fifty in line 81 of the pseudocode of Appendix A. Following iteration on the maximum total weight value, and with no zero overflow solution being found, the procedure returns to step 450 and calls NewWeight to adjust one of the wire weight values. Iteration then begins again on the maximum total weight value. This iterative procedure is repeated in process step 530 until each of the nested wire weight adjustment loops has run over the range of wire weight values specified in process step 430.

At that point, if no solution has been found, the program ends at process step 540. The next step would be to expand the ranges set forth in step 430 and repeat the procedure. Preferably, however, the process terminates in step 510 and there is generated a zero overflow solution. This zero overflow solution will be characterized by various design attributes such as via count, overall length, blockage count and other design values produced as output by the global wiring program that are indicative of the quality of the wiring solution. Based on design goals, the zero overflow solution can be assigned a figure of merit representing a level of optimization of one or more selected design parameters. This figure of merit is empirically determined based on specific optimization goals. Thus, different figures of merit could be calculated for each non-overflow solution depending on the desired optimization values.

The figure of merit is used to compare successive zero overflow solutions generated by changing one or more initial wire weight parameters in the TEST file and rerunning the subwiring program described above. Each time the subwiring program determines a zero overflow solution, the solution can be assigned a figure of merit representing the effect of changing wire weights on one or more values such as overall length, via count, blockage count and congestion within the sub-design. Wire weight changes having the effect of decreasing the figure of merit can be abandoned while changes having the effect of increasing the figure of merit can be continued. Eventually, a listing of zero overflow solutions can be generated and a desired solution representing an optimization of selected design parameters may be chosen for insertion into the final design. An example of such a listing, representing outputs of the pseudocode process of Appendix A, is shown in Appendix C hereto.

Accordingly, a novel sub-problem extraction method for wiring localized congestion areas in VSLI wiring designs has been shown and described. Advantageously, the method provides a novel solution for solving large wiring problems quickly and completely. While several preferred embodiments of the invention have been disclosed, it should be understood that modifications and adaptations thereof will occur to persons skilled in the art. Therefore, the protection afforded the invention should not be limited except in accordance with the spirit of the following claims.

APPENDIX A

```
1    /* Pseudocode finds solution to difficult wire
     problems                                          */
2    /* Extracted from original test code              */
3    /*                                                */
4    Parse UPPER arg test direction
5    /* Input the name of the files that contain the wire
     problem inputs                                    */
6    /* The starting seed weight values are in the file
     type=WANS                                         */
7    /* and have the filename of testM (M for master)  */
8    If test " " then test="TEST"
9    "erase "test" stats F"
10   "erase "test" list1G F"
11   testm - test||"M"
12   "FCOPY "testM"  list10 F "test"  list10 F (REP "
13   "EXECIO " diskr   "testm" WANS F 1 (FINIS STEM WANS."
14   WRITE  -"EXECIO 1 DISKW "test" stats F 0 V 72 (STRING"
15   WRITEA -"EXECIO 1 DISKW "test" WANS  F 0 V 79 (STRING"
16   /* Read the direction to change the weight value
     (user input)                                      */
17
18   If direction = 'u' then
19     wtdel = 0.0625
20   else
21     wtdel = 0-(0.0625)
22   totalrun = 0
23   totalwt = 0
24   /* Get the wt weight from the master file          */
25   wtSave = WANS.4
26   /* Create some ranges for each weight Master + or
     - delta                                           */
27   /* This code does not use the 2 45 degree wire
     weights but                                       */
28   /*   they could be added to the inner loops
29   /* One could create complex distributions but a
     simple one works well                             */
30   /* see the procedure NewWeight for simple example  */
31   er7 = 4
32   er3 = 5
33   er2 = 6
34   er1 = 6
35   eg7 = 2
36   eg4 = 4
37   eg2 = 7
38   eg1 = 8
```

```
39    /* Get the starting values from the master run
      that failed.                                         */
40    Say "The starting Max Factor"  wtSave
41    Parse var WANS.6 sr1 sr2 sr3 sr4 sr5 sr6 sr7 rest
42    Parse var WANS.8 sg1 sg2 sg3 sg4 sg5 sg6 sg7 rest
43    Say "The starting wire lev 1 codes" sr1 sr2 sr3 sr7
44    Say "The starting wire lev 2 codes" sg1 sg2 sg4 sg7
45    WRITE Right("wt",10) Right("Via",5) Right("Len",10)
      Right("FAIL",5)    N E V J N E V J MaxF Path DeltaMF"
46    /* The following loops should be sorted by the
      user depending                                       */
47    /* on what one feels has the best chance of
      creating a change                                    */
48    /* that will allow a solution.  Changing this
      order will only                                      */
49    /* reduce run time.                                  */
50    /* Users usually feel wire direction weights are
      more important                                       */
51    /* than jog weights.                                 */
52    /* Notice goal is to try a weight on  each side
      of the master                                        */
53    /* starting value and work outward to the end
      of each plus and                                     */
54    /* minus range endpoint                              */
55    ┌Do ir7 = 1          to er7
56    │  Call NewWeight ir7 rr7 sr7
57    │ ┌Do ig7 = 1          to eg7
58    │ │  Call NewWeight ig7 gg7 sg7
59    │ │ ┌Do ir = 3          to er3
60    │ │ │  Call NewWeight ir3 rr3 sr3
61    │ │ │ ┌Do ig4 = 1          to eg4
62    │ │ │ │  Call NewWeight tg4 gg4 sg4
63    │ │ │ │ ┌Do ir2 = 1          to er2
64    │ │ │ │ │  Call NewWeight ir2 rr2 sr2
65    │ │ │ │ │ ┌Do ir1 = 1          to er1
66    │ │ │ │ │ │  Call NewWeight ir1 rr1 sr1
67    │ │ │ │ │ │ ┌Do ig2 = 1          to eg2
68    │ │ │ │ │ │ │  Call NewWeight ig2 gg2 sg2
69    │ │ │ │ │ │ │ ┌Do ig1 = 1          to eg1
70    │ │ │ │ │ │ │ │  Call NewWeight tg1 gg1 sg1
71  /*│ │ │ │ │ │ │ │Setup to write out the weights for the wire
      │ │ │ │ │ │ │ │program to read                       */
72    │ │ │ │ │ │ │ │  WANS.6="0"rr1 "0"rr2 "0"rr3 r4 r5 r6 rr77
73    │ │ │ │ │ │ │ │  WANS.11="0"gg1 "0"gg2 g3 "0"gg4 g5 g6 gg7
74    │ │ │ │ │ │ │ │  "Erase "test" CONTACT F"
```

28

SA9-91-071

```
 75      "Erase "test" WIRED F"
 76      wts = WtSave
 77      totalwt = 0
 78      FMF2 = 999
 79      FP2 = 999
 80      OV2 = 999
 81      Do wti = 0        to 50
 82        wt = wts + wti*wtdel
 83        WANS.4 = wt
 84        "Erase "test" WANS F"                    */
 85   /* Write out the new weights
 86        Do I = 1          to wans.0
 87          WRITEA WANS.I
 88        End I
 89        "Erase "test" OUTPUT F"
 90   /* Run the wire program with up to 50 changes
          before new weights                        */
 91
 92        FMF= FMF2
 93        FP = FP2
 94        OV = OV2
 95   /* Run the wire program                       */
 96        CALL WIRE W W test
 97        totalrun=totalrun+1
 98        totalwt =totalwt +1
 99        "EXECIP * DISKR "test" OUTPUT F 1
          (FINIS STEM OUT2."
100        FMF2 = SUBWORD(OUT2.1,3,1)
101        F2P=SUBWORD(OUT2.1,8,1)
102        OV2=SUBWORD(OUT2.1,5,1)
103        OVD=OV-OV2
104        Dmf2 = FMF-FMF2
105   /* Check for a solution                       */
106        Say "Ov Del" Right(OVD,5) "Path" =
          Right(F2P,5) "OV2="OV2
107        If OV2=0 Then do
108          Say "******Found a solution for 0 overflow,
              totalwt="totalwt
109          totalwt = 0
110          Exit
111        End
112        If (OVD=0 & F2P=0) & Dmf2=0 Then do
113          If Dmf2=0 Then Say "******found path = 0
              and overflow del*0 but NF Del-0"
114          Say "Increase Max Factor from "wt"
```

```
115        totalwt=" totalwt
116        Say      rr1 rr2 rr3 rr7 gg1 gg2 gg4 gg7
117        totalwt = 0
118        iterate wti
119       End
120      If wti=50 then do
121       Say "Could not find a solution, try
              new wans"
122       Say "The totalwt was=" totalwt totalrun
123       Say      rr1 rr2 rr3 rr7 gg1 gg2 gg4 gg7
124       totalwt = 0
125      End
126     End wti
127    End gg1
128   End gg2
129  End rr1
130  End rr2
131 End gg4
132 End rr3
133 End gg7
134 End rr7
135 Say "Loops completed No solution found.  Expand ranges"
     Exit
```

APPENDIX B

```
 1   PROCEDURE NewWeight
 2   This is an example, the Procedure could be more
 3   general and handle a larger range of index values
 4   parse arg index rg s
 5   ┌Select index
 6   │1:
 7   │  rg = s
 8   │2:
 9   │  rg = s + 1
10   │3:
11   │  rg = s - 1
12   │4:
13   │  rg = s + 2
14   │5:
15   │  rg = s - 2
16   │6:
17   │  rg = s + 3
18   │7:
19   │  rg = s - 3
20   │8:
21   │  rg = s + 4
22   │9:
23   │  rg = s - 4
24   │ otherwise "Say index exceeds range"
25   └End
```

APPENDIX C

These solutions were found by using the invention when conventional techniques failed.

|  | wt | Via | Len | OVER FLOW | LEVEL 1 N E V J | LEVEL 2 N E V J | MaxF |
|---|---|---|---|---|---|---|---|
|  | 3.5000 | 38 | 5240.0 | 0 | 2 4 4 2 | 2 1 2 2 | 2.079 |
|  | 2.8750 | 40 | 5260.0 | 0 | 1 3 4 2 | 3 1 2 2 | 1.386 |
|  | 2.1250 | 41 | 5260.0 | 0 | 2 2 3 2 | 2 1 2 2 | 1.491 |
|  | 4.0000 | 39 | 5270.0 | 0 | 1 4 4 3 | 2 1 2 2 | 3.111 |
|  | 2.5625 | 39 | 5270.0 | 0 | 2 3 4 2 | 3 1 2 2 | 1.980 |
|  | 3.1875 | 39 | 5270.0 | 0 | 2 4 3 3 | 3 1 2 2 | 2.044 |
|  | 1.6875 | 40 | 5270.0 | 0 | 1 2 3 2 | 2 1 2 2 | 1.371 |
|  | 2.7500 | 39 | 5280.0 | 0 | 1 2 4 3 | 2 1 2 2 | 1.734 |
|  | 2.1250 | 39 | 5280.0 | 0 | 1 2 3 3 | 3 1 2 2 | 1.359 |
|  | 2.3125 | 39 | 5280.0 | 0 | 2 2 3 3 | 3 1 2 2 | 2.036 |
|  | 2.1875 | 39 | 5280.0 | 0 | 2 2 4 3 | 3 1 2 2 | 1.596 |
|  | 3.2500 | 40 | 5280.0 | 0 | 1 4 4 4 | 3 1 2 2 | 1.590 |
|  | 2.3750 | 41 | 5280.0 | 0 | 2 3 4 2 | 2 1 2 2 | 1.521 |
|  | 2.8750 | 42 | 5280.0 | 0 | 1 2 4 2 | 2 1 2 2 | 1.078 |
|  | 2.9375 | 38 | 5290.0 | 0 | 2 3 5 3 | 3 1 2 2 | 2.212 |
|  | 2.9375 | 38 | 5290.0 | 0 | 2 4 5 3 | 3 1 2 2 | 1.632 |
|  | 3.0000 | 39 | 5290.0 | 0 | 2 2 5 4 | 3 1 2 2 | 2.414 |
|  | 2.6875 | 41 | 5290.0 | 0 | 2 2 3 3 | 2 1 2 2 | 2.234 |
|  | 2.3125 | 43 | 5290.0 | 0 | 1 3 2 3 | 2 1 2 2 | 1.200 |
|  | 3.1250 | 43 | 5290.0 | 0 | 1 3 2 4 | 2 1 2 2 | 2.113 |
|  | 3.6875 | 45 | 5290.0 | 0 | 2 4 2 4 | 3 1 2 2 | 2.135 |
|  | 3.5625 | 38 | 5300.0 | 0 | 1 4 5 2 | 2 1 2 2 | 2.783 |
|  | 2.7500 | 40 | 5300.0 | 0 | 2 2 5 3 | 3 1 2 2 | 2.228 |
|  | 3.7500 | 43 | 5300.0 | 0 | 1 4 2 3 | 2 1 2 2 | 2.005 |
|  | 2.5000 | 40 | 5310.0 | 0 | 2 2 4 4 | 2 1 2 2 | 1.885 |
|  | 2.8750 | 42 | 5310.0 | 0 | 2 3 2 4 | 2 1 2 2 | 1.732 |
|  | 3.5000 | 43 | 5310.0 | 0 | 2 3 2 5 | 2 1 2 2 | 2.755 |
|  | 2.2500 | 45 | 5310.0 | 0 | 2 2 3 2 | 3 1 2 2 | 2.216 |
|  | 4.0000 | 45 | 5310.0 | 0 | 2 3 4 4 | 3 1 2 2 | 2.821 |
|  | 3.3750 | 49 | 5310.0 | 0 | 1 4 2 2 | 3 1 2 2 | 1.508 |
|  | 3.3750 | 49 | 5310.0 | 0 | 1 3 2 3 | 3 1 2 2 | 1.508 |
|  | 2.8125 | 41 | 5320.0 | 0 | 1 3 4 3 | 2 1 2 2 | 2.176 |
|  | 2.8125 | 44 | 5320.0 | 0 | 2 3 3 2 | 3 1 2 2 | 2.222 |
|  | 3.6250 | 47 | 5320.0 | 0 | 1 4 2 5 | 2 1 2 2 | 1.312 |
|  | 3.4375 | 50 | 5320.0 | 0 | 1 4 2 3 | 3 1 2 2 | 1.482 |
|  | 3.5000 | 54 | 5320.0 | 0 | 1 2 2 5 | 3 1 2 2 | 2.500 |
|  | 2.6875 | 40 | 5330.0 | 0 | 2 3 5 3 | 2 1 2 2 | 2.129 |
|  | 2.8750 | 41 | 5330.0 | 0 | 2 2 4 3 | 2 1 2 2 | 1.617 |
|  | 2.6250 | 42 | 5330.0 | 0 | 1 3 2 2 | 2 1 2 2 | 1.312 |
|  | 2.8125 | 42 | 5330.0 | 0 | 2 4 4 3 | 2 1 2 2 | 1.616 |

SA9-91-071

| | | | | | | | | | |
|---|---|---|---|---|---|---|---|---|---|
| 2.8750 | 42 | 5330.0 | 0 | 2 3 4 4 | 2 1 2 2 | 1.617 |
| 2.8750 | 42 | 5330.0 | 0 | 2 2 4 5 | 2 1 2 2 | 1.617 |
| 2.8750 | 43 | 5330.0 | 0 | 2 4 5 4 | 3 1 2 2 | 1.742 |
| 3.4375 | 45 | 5330.0 | 0 | 2 4 3 5 | 2 1 2 2 | 2.466 |
| 3.0625 | 46 | 5330.0 | 0 | 1 3 4 4 | 3 1 2 2 | 2.414 |
| 2.8125 | 47 | 5330.0 | 0 | 1 2 4 4 | 2 1 2 2 | 2.049 |
| 3.5000 | 39 | 5340.0 | 0 | 2 2 4 4 | 3 1 2 2 | 2.038 |
| 3.6250 | 45 | 5340.0 | 0 | 2 4 4 5 | 2 1 2 2 | 1.943 |
| 4.0000 | 59 | 5340.0 | 0 | 1 4 3 4 | 2 1 2 2 | 2.077 |
| 2.8750 | 39 | 5350.0 | 0 | 2 2 2 2 | 3 1 2 2 | 2.009 |
| 4.0000 | 40 | 5350.0 | 0 | 1 2 5 2 | 2 1 2 2 | 1.103 |
| 2.6875 | 45 | 5350.0 | 0 | 1 2 3 2 | 3 1 2 2 | 1.039 |
| 3.0000 | 56 | 5350.0 | 0 | 1 3 3 5 | 2 1 2 2 | 1.519 |
| 2.7500 | 39 | 5360.0 | 0 | 2 3 5 2 | 3 1 2 2 | 2.332 |
| 2.5000 | 40 | 5360.0 | 0 | 1 2 3 3 | 2 1 2 2 | 1.354 |
| 3.2500 | 44 | 5360.0 | 0 | 1 4 3 3 | 2 1 2 2 | 1.971 |
| 2.8125 | 44 | 5360.0 | 0 | 2 3 2 2 | 3 1 2 2 | 2.014 |
| 3.8750 | 46 | 5360.0 | 0 | 1 2 5 2 | 3 1 2 2 | 1.799 |
| 3.1875 | 49 | 5360.0 | 0 | 1 3 3 4 | 3 1 2 2 | 1.663 |
| 3.0625 | 39 | 5370.0 | 0 | 1 3 5 2 | 2 1 2 2 | 1.427 |
| 2.6250 | 46 | 5370.0 | 0 | 1 2 4 4 | 3 1 2 2 | 1.500 |
| 3.0000 | 47 | 5370.0 | 0 | 1 2 4 3 | 3 1 2 2 | 2.789 |
| 2.8125 | 48 | 5370.0 | 0 | 2 4 3 4 | 2 1 2 2 | 1.612 |
| 2.8125 | 48 | 5370.0 | 0 | 2 3 3 5 | 2 1 2 2 | 1.650 |
| 3.7500 | 48 | 5370.0 | 0 | 2 4 2 3 | 3 1 2 2 | 3.155 |
| 2.7500 | 42 | 5380.0 | 0 | 2 4 5 2 | 2 1 2 2 | 2.630 |
| 2.7500 | 42 | 5380.0 | 0 | 1 3 5 4 | 2 1 2 2 | 1.784 |
| 4.0000 | 42 | 5380.0 | 0 | 2 4 4 3 | 3 1 2 2 | 3.000 |
| 3.3750 | 45 | 5380.0 | 0 | 1 2 5 3 | 2 1 2 2 | 1.898 |
| 3.6250 | 45 | 5380.0 | 0 | 1 4 4 5 | 2 1 2 2 | 3.387 |
| 3.7500 | 46 | 5380.0 | 0 | 2 4 2 5 | 2 1 2 2 | 2.005 |
| 3.0625 | 47 | 5380.0 | 0 | 2 4 2 3 | 2 1 2 2 | 1.621 |
| 3.3125 | 47 | 5380.0 | 0 | 1 2 2 4 | 2 1 2 2 | 1.242 |
| 3.1875 | 48 | 5380.0 | 0 | 1 4 3 3 | 3 1 2 2 | 2.603 |
| 2.8125 | 50 | 5380.0 | 0 | 1 3 2 2 | 3 1 2 2 | 1.539 |
| 2.5625 | 41 | 5390.0 | 0 | 2 2 5 4 | 2 1 2 2 | 1.907 |
| 1.8125 | 44 | 5390.0 | 0 | 1 2 2 2 | 2 1 2 2 | 1.160 |
| 2.8750 | 45 | 5390.0 | 0 | 2 2 4 2 | 2 1 2 2 | 2.078 |
| 1.9375 | 45 | 5390.0 | 0 | 1 3 4 2 | 2 1 2 2 | 1.435 |
| 1.9375 | 46 | 5390.0 | 0 | 1 4 5 2 | 3 1 2 2 | 1.661 |
| 3.2500 | 38 | 5400.0 | 0 | 1 4 5 3 | 2 1 2 2 | 1.279 |
| 3.1875 | 44 | 5400.0 | 0 | 2 3 3 4 | 3 1 2 2 | 1.557 |
| 2.9375 | 46 | 5400.0 | 0 | 1 4 2 2 | 2 1 2 2 | 1.313 |
| 3.2500 | 56 | 5400.0 | 0 | 1 2 3 5 | 2 1 2 2 | 1.556 |
| 2.2500 | 41 | 5410.0 | 0 | 2 2 2 2 | 2 1 2 2 | 2.095 |

| | | | | | | | | | | | | |
|---|---|---|---|---|---|---|---|---|---|---|---|---|
| 3.1250 | 43 | 5410.0 | 0 | 1 | 3 | 5 | 5 | 2 | 1 | 2 | 2 | 2.225 |
| 2.8125 | 46 | 5410.0 | 0 | 2 | 2 | 2 | 3 | 3 | 1 | 2 | 2 | 2.639 |
| 3.0000 | 47 | 5410.0 | 0 | 1 | 4 | 3 | 2 | 2 | 1 | 2 | 2 | 1.577 |
| 3.0000 | 47 | 5410.0 | 0 | 1 | 4 | 4 | 2 | 2 | 1 | 2 | 2 | 1.615 |
| 3.6875 | 52 | 5410.0 | 0 | 1 | 4 | 3 | 4 | 3 | 1 | 2 | 2 | 2.399 |
| 4.0000 | 43 | 5420.0 | 0 | 1 | 4 | 5 | 4 | 3 | 1 | 2 | 2 | 2.706 |
| 3.8125 | 44 | 5420.0 | 0 | 2 | 2 | 5 | 2 | 3 | 1 | 2 | 2 | 1.978 |
| 3.1250 | 48 | 5420.0 | 0 | 2 | 4 | 2 | 4 | 2 | 1 | 2 | 2 | 1.701 |
| 3.5000 | 47 | 5430.0 | 0 | 2 | 2 | 2 | 4 | 3 | 1 | 2 | 2 | 2.269 |
| 3.8125 | 50 | 5430.0 | 0 | 1 | 3 | 4 | 4 | 2 | 1 | 2 | 2 | 1.973 |
| 2.8125 | 49 | 5440.0 | 0 | 1 | 3 | 3 | 3 | 2 | 1 | 2 | 2 | 2.344 |
| 3.3125 | 43 | 5450.0 | 0 | 1 | 2 | 5 | 5 | 2 | 1 | 2 | 2 | 1.306 |
| 3.0625 | 48 | 5450.0 | 0 | 1 | 3 | 5 | 4 | 3 | 1 | 2 | 2 | 2.055 |
| 3.6875 | 54 | 5450.0 | 0 | 2 | 4 | 3 | 4 | 3 | 1 | 2 | 2 | 2.226 |
| 2.1875 | 45 | 5460.0 | 0 | 1 | 2 | 4 | 2 | 3 | 1 | 2 | 2 | 1.528 |
| 3.8125 | 48 | 5460.0 | 0 | 1 | 2 | 4 | 5 | 2 | 1 | 2 | 2 | 3.276 |
| 3.0625 | 48 | 5460.0 | 0 | 1 | 4 | 5 | 3 | 3 | 1 | 2 | 2 | 1.706 |
| 2.9375 | 46 | 5480.0 | 0 | 1 | 3 | 5 | 2 | 3 | 1 | 2 | 2 | 1.576 |
| 3.000 | 46 | 5480.0 | 0 | 1 | 2 | 5 | 3 | 3 | 1 | 2 | 2 | 1.607 |
| 3.0000 | 46 | 5480.0 | 0 | 1 | 3 | 5 | 3 | 3 | 1 | 2 | 2 | 1.679 |
| 3.0000 | 46 | 5480.0 | 0 | 1 | 2 | 5 | 4 | 3 | 1 | 2 | 2 | 1.714 |
| 2.7500 | 49 | 5490.0 | 0 | 1 | 4 | 4 | 2 | 3 | 1 | 2 | 2 | 1.250 |
| 2.7500 | 49 | 5490.0 | 0 | 1 | 3 | 4 | 3 | 3 | 1 | 2 | 2 | 1.250 |
| 2.2500 | 43 | 5500.0 | 0 | 2 | 2 | 2 | 4 | 2 | 1 | 2 | 2 | 1.835 |
| 3.1875 | 45 | 5500.0 | 0 | 2 | 4 | 3 | 3 | 2 | 1 | 2 | 2 | 1.975 |
| 2.7500 | 45 | 5500.0 | 0 | 2 | 2 | 3 | 4 | 2 | 1 | 2 | 2 | 1.915 |
| 3.1875 | 45 | 5500.0 | 0 | 2 | 3 | 3 | 4 | 2 | 1 | 2 | 2 | 1.975 |
| 3.6875 | 45 | 5500.0 | 0 | 2 | 4 | 4 | 4 | 2 | 1 | 2 | 2 | 2.087 |
| 3.6875 | 45 | 5500.0 | 0 | 2 | 4 | 5 | 4 | 2 | 1 | 2 | 2 | 2.122 |
| 3.1875 | 45 | 5500.0 | 0 | 2 | 2 | 3 | 5 | 2 | 1 | 2 | 2 | 1.975 |
| 3.6875 | 45 | 5500.0 | 0 | 2 | 3 | 4 | 5 | 2 | 1 | 2 | 2 | 2.087 |
| 3.1875 | 45 | 5500.0 | 0 | 2 | 2 | 5 | 5 | 2 | 1 | 2 | 2 | 2.044 |
| 3.6875 | 45 | 5500.0 | 0 | 2 | 3 | 5 | 5 | 2 | 1 | 2 | 2 | 2.122 |
| 3.3125 | 55 | 5500.0 | 0 | 2 | 3 | 2 | 4 | 3 | 1 | 2 | 2 | 1.893 |
| 2.9375 | 56 | 5500.0 | 0 | 1 | 4 | 2 | 4 | 3 | 1 | 2 | 2 | 1.739 |
| 2.8125 | 49 | 5510.0 | 0 | 1 | 2 | 3 | 4 | 2 | 1 | 2 | 2 | 2.123 |
| 3.2500 | 48 | 5550.0 | 0 | 2 | 2 | 5 | 2 | 2 | 1 | 2 | 2 | 2.321 |
| 3.3125 | 48 | 5550.0 | 0 | 2 | 3 | 5 | 2 | 2 | 1 | 2 | 2 | 2.311 |
| 3.3125 | 48 | 5550.0 | 0 | 2 | 2 | 5 | 3 | 2 | 1 | 2 | 2 | 2.311 |
| 2.8750 | 49 | 5570.0 | 0 | 1 | 3 | 5 | 3 | 2 | 1 | 2 | 2 | 1.797 |
| 2.8750 | 49 | 5570.0 | 0 | 1 | 2 | 5 | 4 | 2 | 1 | 2 | 2 | 1.797 |

We claim:

1. A computer implementable method for wiring congested areas in a VLSI design following a failed global wiring attempt, comprising the steps of
   - detecting a congested area containing one or more identified invalid net segments in the VLSI design using the output of a global wiring program which has produced the failed global wiring attempt and which output contains a listing of said one or more identified invalid net segments;
   - determining a bounding area for the congested area which is larger in size than said congested area;
   - fixing perimeter attachment points at locations where wires cross the bounding area;
   - extracting the bounding area and the perimeter attachment points as a sub-problem extraction area from the VLSI design;
   - associating wiring parameters with the sub-problem extraction area;
   - setting wire weights for the wiring parameters;
   - wiring the sub-problem extraction area to derive a wired solution by:
     (a) attempting to wire the sub-problem extraction area in accordance with the wire weights,
     (b) in response to the wiring attempt completing unsuccessfully, changing at least one of the wire weights,
     (c) repeating sub-steps (a) and (b) until a wiring attempt completes successfully; and
   - placing the wired solution for the sub-problem extraction area back into the VLSI design.

2. A computer-implementable method as recited in claim 1, wherein the congested area is detected by identifying blockages in the VLSI design.

3. A computer-implementable method as recited in claim 1, wherein the bounding area is in the shape of a rectangle.

4. A computer-implementable method as recited in claim 1, wherein a minimum bounding area is determined by identifying invalid net segments (ISEGs).

5. A computer-implementable method as recited in claim 1, wherein an enlarged bounding area is determined using valid net segments (VSEGs).

6. A computer-implementable method as recited in claim 1, wherein circuit blockages are captured inside the bounding area.

7. A computer-implementable method as recited in claim 1, wherein sub-step (a) further includes ripping out and rewiring portions of the sub-problem extraction area as required to successfully wire the sub-problem extraction area.

8. A computer-implementable method as recited in claim 1, wherein the wire weights include any of wire directions, wire jogs, level changes, wire level, maximum wire length, via count, via adjacency rules and net list order.

9. A computer-implementable method as recited in claim 1, further comprising, after the sub-step of wiring the sub-problem extraction area, a step of determining a figure of merit, the figure of merit being a function of the effect of the wire weights on one or more values representing overall wire length, via count, blockage count, or congestion within the sub-problem extraction area.

10. A computer-implementable method as recited in claim 9, wherein the sub-step of setting wire weights includes the step of changing the wire weights responsive to trends in the figure of merit, such that changes having the effect of globally decreasing the figure of merit are abandoned while changes having the effect of increasing the figure of merit are continued.

11. A computer-implementable method for wiring congested areas in a VLSI design following a failed global wiring attempt, comprising the steps of:
   - detecting a congested area containing one or more identified invalid net segments in the VLSI design using the output of a global wiring program which has produced the failed global wiring attempt and which output contains a listing of said one or more identified invalid net segments;
   - determining a bounding area for the congested area which is larger in size than said congested area;
   - fixing perimeter attachment points at locations where wires cross the bounding area;
   - extracting from said VLSI design the bounding area and the perimeter attachment points as a sub-problem extraction area;
   - associating wiring parameters with the sub-problem extraction area;
   - generating initial weight values for the wiring parameters including a maximum total weight value associated with the sub-problem extraction area;
   - setting wire weight iteration range values;
   - modifying in a series of iterative nested loops the maximum total weight followed by selected other wire weight values, and during each wire weight modification iteration, performing the following steps:
     (a) running said global wiring program based on the modified wire weight values;
     (b) testing for a zero overflow solution;
     (c) if a zero overflow solution is found, outputting one or more attributes associated with the zero overflow solution; and
     (d) if a zero overflow solution is not found, repeating sub-steps (a)–(d) using a next modified wire weight parameter.

12. A computer-implementable method as recited in claim 11, wherein the congested area is detected by identifying blockages in the VLSI design.

13. A computer-implementable method as recited in claim 11, wherein the bounding area is in the shape of a rectangle.

14. A computer-implementable method as recited in claim 11, wherein a minimum bounding area is determined by identifying invalid net segments (ISEGs).

15. A computer-implementable method as recited in claim 11, wherein an enlarged bounding area is determined using valid net segments (VSEGs).

16. A computer-implementable method as recited in claim 11, wherein circuit blockages are captured inside the bounding area.

17. A computer-implementable method as recited in claim 11, wherein the step of modifying wire weight values further includes ripping out and rewiring portions of the sub-problem extraction area as required to successfully wire the sub-problem extraction area.

18. A computer-implementable method as recited in claim 11, wherein the wire weights include any of wire directions, wire jogs, level changes, wire level, maximum wire length, via count, via adjacency rules and net list order.

19. A computer-implementable method as recited in claim 11, further comprising, after the step of finding a zero overflow solution, a step of determining a figure of merit, the figure of merit being a function of the effect of the wire weight values on one or more values representing overall wire length, via count, blockage count or congestion within the sub-problem extraction area.

20. A computer-implementable method as recited in claim 19, wherein the sub-step of generating initial values for wire weight parameters includes the step of generating wire weight values responsive to trends in the figure of merit, such that changes having the effect of globally decreasing the figure of merit are abandoned while changes having the effect of increasing the figure of merit are continued.

21. A computer-implementable method for wiring congested areas in a VLSI design following a failed global wiring attempt, comprising the steps of:

detecting a congested area containing one or more identified invalid net segments in the VLSI design using the output of a global wiring program which has produced the failed global wiring attempt and which output contains a listing of said one or more identified invalid net segments, said congested area having a plurality of net pairs of varying length;

determining a bounding area for the congested area which is larger in size than said congested area;

fixing perimeter attachment points at locations where wires cross the bounding area;

extracting the bounding area and the perimeter attachment points as a sub-problem extraction area from the VLSI design;

associating wiring parameters with the sub-problem extraction area;

setting empirically determined, starting wire weight values for the wiring parameters;

commencing a sub-problem extraction area wiring attempt by executing said global wiring program using said starting wire weight values as input:

if said sub-problem extraction area remains congested, adjusting said wire weights by swapping selected net pairs in said sub-problem extraction area with a same length and rewiring the sub-problem extraction area until all net pairs of each length have been tested; and if said sub-problem extraction area still remains congested, iteratively adjusting other wire weight values over a range of values above and below the starting weight values in a series of nested loops until a zero overflow solution is found.

\* \* \* \* \*